United States Patent
Briano

(10) Patent No.: US 10,498,384 B2
(45) Date of Patent: *Dec. 3, 2019

(54) SIGNAL ISOLATOR HAVING MAGNETIC SIGNAL LATCHING

(71) Applicant: Allegro MicroSystems, LLC, Manchester, NH (US)

(72) Inventor: Robert A. Briano, Auburn, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 16/256,215

(22) Filed: Jan. 24, 2019

(65) Prior Publication Data

US 2019/0173514 A1 Jun. 6, 2019

Related U.S. Application Data

(63) Continuation of application No. 15/801,679, filed on Nov. 2, 2017, now Pat. No. 10,236,932.

(51) Int. Cl.
*H04B 1/44* (2006.01)
*G01R 33/09* (2006.01)
*H04B 17/17* (2015.01)

(52) U.S. Cl.
CPC ............. *H04B 1/44* (2013.01); *G01R 33/09* (2013.01); *H04B 17/17* (2015.01)

(58) Field of Classification Search
CPC . H04B 1/3888; A45F 5/00; A45F 5/10; A45F 2005/008; A45F 2005/1013; A45F 2200/0516; A45F 2200/0525
USPC ........................................... 455/575.1, 575.8
See application file for complete search history.

(56) References Cited

U.S. PATENT DOCUMENTS

| | | |
|---|---|---|
| 4,399,557 A | 8/1983 | Muszkiewicz |
| 5,831,426 A | 11/1998 | Black, Jr. et al. |
| 6,054,780 A | 4/2000 | Haigh et al. |
| 6,300,617 B1 | 10/2001 | Daughton et al. |
| 6,873,065 B2 | 3/2005 | Haigh et al. |
| 7,259,545 B2 | 8/2007 | Stauth et al. |
| 7,768,083 B2 | 8/2010 | Doogue et al. |
| 7,973,527 B2 | 7/2011 | Taylor et al. |
| 8,063,634 B2 | 11/2011 | Sauber et al. |
| 9,287,917 B1* | 3/2016 | Tages .................. H04B 1/3888 |
| 2002/0135236 A1 | 9/2002 | Haigh et al. |
| 2008/0311862 A1 | 12/2008 | Spina et al. |

(Continued)

FOREIGN PATENT DOCUMENTS

EP 2 393 888 A1 3/2018

OTHER PUBLICATIONS

Extended European Search Report dated Mar. 15, 2019 for European Application No. 18202972.8; 8 Pages.
U.S. Appl. No. 15/702,937, filed Sep. 13, 2017, Latham et al.
U.S. Appl. No. 15/702,940, filed Sep. 13, 2017, Latham et al.
U.S. Appl. No. 15/671,357, filed Aug. 8, 2017, Briano.
U.S. Appl. No. 15/705,487, filed Sep. 15, 2017, Briano.

(Continued)

*Primary Examiner* — Edward F Urban
*Assistant Examiner* — Max Mathew
(74) *Attorney, Agent, or Firm* — Daly Crowley Mofford & Durkee, LLP

(57) ABSTRACT

Methods and apparatus for transmitting signals that are magnetically latched at a receiver. In embodiments, a signal isolator comprises a transmitter and a receiver on separate die. Signal disruptions may be minimized. In embodiments, the transmitter and/or receiver can be monitored for proper operation.

55 Claims, 7 Drawing Sheets

(56) References Cited

U.S. PATENT DOCUMENTS

| | | | |
|---|---|---|---|
| 2010/0329364 A1 | 12/2010 | Giombanco et al. | |
| 2011/0205696 A1* | 8/2011 | Kawada | G06F 1/1616 361/679.01 |
| 2012/0243152 A1* | 9/2012 | Kawada | G06F 1/1613 361/679.01 |
| 2012/0257342 A1* | 10/2012 | Shindo | H05K 5/023 361/679.02 |
| 2014/0054910 A1* | 2/2014 | Kim | H04B 1/385 294/158 |
| 2014/0226292 A1* | 8/2014 | Mochizuki | G06F 1/1626 361/752 |
| 2015/0004902 A1 | 1/2015 | Pigott et al. | |
| 2015/0304466 A1* | 10/2015 | Tamatsu | H04M 1/04 379/447 |
| 2016/0014829 A1 | 1/2016 | Hasegawa | |
| 2017/0012622 A1 | 1/2017 | Peter et al. | |
| 2017/0207655 A1 | 7/2017 | Chang et al. | |

OTHER PUBLICATIONS

U.S. Appl. No. 15/453,034, filed Mar. 8, 2017, Milesi et al.
U.S. Appl. No. 15/689,185, filed Aug. 29, 2017, Chetlur et al.
U.S. Appl. No. 15/801,679, filed Nov. 2, 2017, Briano.
U.S. Non-Final Office Action dated Oct. 9, 2018 for U.S. Appl. No. 15/801,679; 15 Pages.
Response to U.S. Non-Final Office Action dated Oct. 9, 2018 for U.S. Appl. No. 15/801,679; Response filed Nov. 15, 2018; 8 Pages.
U.S. Notice of Allowance dated Dec. 14, 2018 for U.S. Appl. No. 15/801,679; 8 Pages.

* cited by examiner

10,498,384 B2

SIGNAL ISOLATOR HAVING MAGNETIC SIGNAL LATCHING

CROSS REFERENCE TO RELATED APPLICATIONS

This application is a continuation application of U.S. patent application Ser. No. 15/801,679 filed on Nov. 2, 2017, and entitled "SIGNAL ISOLATOR HAVING MAGNETIC SIGNAL LATCHING," which application is hereby incorporated herein by reference in its entirety.

BACKGROUND

As is known in the art, signal isolators can be used to transfer information across a barrier used to separate voltage domains for safety or functional isolation. For example, optocouplers include a LED that emits light through an optically transparent insulating film and strikes a photo detector that generates a current flow that corresponds to the emitted light. RF carriers can also be used to transmit information across an isolation barrier.

SUMMARY

The present invention provides methods and apparatus for a signal isolator having magneto-resistive elements to latch information. In embodiments, data is transmitted across the isolation barrier as a magnetic field and received by a by magnetoresistive structure. By latching data magnetically, the signal isolator will recover relatively quickly from any one of many forms of electrical interference that may disrupt the data transfer. In embodiments, the signal isolator may monitor data transmission and reception across the isolation barrier. In some embodiments, a signal isolator indicates on one or both sides of the barrier whether the isolator is operating properly.

In one aspect, a signal isolator comprises: a transmitter comprising: a transmit module to receive an input signal; and a transmit current latching module to magnetically latch an output of the transmit module; and a receiver comprising: a receive module including a receiver magnetic field sensing element to detect and magnetically latch a current signal from the transmit current latching module.

A signal isolator can further include one or more of the following features: the transmit module further includes a transmitter receive module to receive signals from the receiver, the receiver further includes: a receiver echo module coupled to the receiver magnetic field sensing element; and a receive current latching module to receive an output of the receiver echo module and transmit an output to the transmitter receive module, a barrier region between the transmitter and the receiver, the transmitter and the receiver are disposed on separate die, the receiver magnetic field sensing element includes a magnetoresitive element, the magnetoresistive element comprises a bi-stable magnetoresistive element, the transmit module includes a controller, the controller monitors a state of the input signal, the transmit current latching module, and a transmitter receive module, the controller is configured to resend a signal from the transmitter to the receiver when a disruption of the input signal is detected, the disruption is detected when a timeout is exceeded, and/or a watchdog timer coupled to a receive echo module to detect faults in the receiver module and/or transmit module when data signals are not present.

In another aspect, a method of communicating signals from a transmitter to a receiver isolated from the transmitter comprises: employing a transmitter having a transmit module to receive an input signal and a transmit current latching module to magnetically latch an output of the transmit module; and employing a receiver having a receive module including a receiver magnetic field sensing element to detect and magnetically latch a signal from the transmit current latching module.

A method can further include one or more of the following features: the transmit module further includes a transmitter receive module to receive signals from the receiver, the receiver further includes: a receiver echo module coupled to the receiver magnetic field sensing element; and a receive current latching module to receive an output of the receiver echo module and transmit an output to the transmitter receive module, employing a barrier region between the transmitter and the receiver, the transmitter and the receiver are disposed on separate die, the receiver magnetic field sensing element includes a magnetoresitive element, the magnetoresistive element comprises a bi-stable magnetoresistive element, employing a controller to monitor a state of the input signal, the transmit current latching module, and a transmitter receive module, the controller is configured to resend a signal from the transmitter to the receiver when a disruption of the input signal is detected, the disruption is detected when a timeout is exceeded, and/or employing a watchdog timer coupled to a receive echo module to detect faults in the receiver module and/or transmit module when data signals are not present.

In a further aspect, a signal isolator comprises: a transmitter comprising: a transmit means to receive an input signal; and a transmit current latching means to magnetically latch an output of the transmit means; and a receiver comprising: a receive means including a receiver magnetic field sensing means for detecting and magnetically latching a signal from the transmit latching means.

BRIEF DESCRIPTION OF THE DRAWINGS

The foregoing features of this invention, as well as the invention itself, may be more fully understood from the following description of the drawings in which.

DETAILED DESCRIPTION

Figure 1:
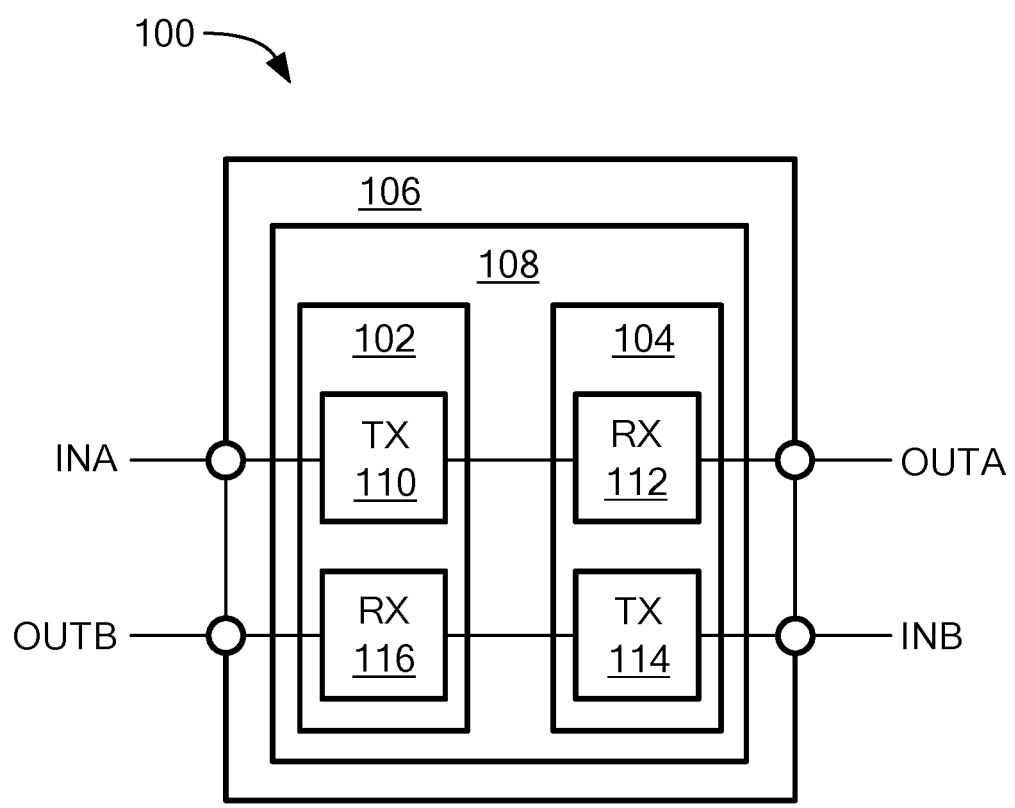
FIG. 1 is a schematic representation of a signal isolator having magnetic signal latching in accordance with example embodiments of the invention.

FIG. 1 shows an example of a signal isolator 100 including first and second dies 102, 104 that form part of an integrated circuit package 106 having magnetic signal latching in accordance with example embodiments of the invention. In an embodiment, the IC package 106 includes a first input signal INA connected to the first die 102 and a first output signal OUTA connected to the second die 104. The IC package 106 further includes a second input signal INB connected to the second die 104 and a second output signal OUTB to the first die 104. The first and second dies 102, 104 are separated by a barrier region 108, such as an isolation barrier.

In embodiments, the first die 102 includes a first transmit module 110 and the second die includes a first receive module 112 that provides a signal path from the first input signal INA to the first output signal OUTA across the barrier 108. The second die 104 includes a second transmit module 114 and the first die 104 includes a second receive module 116 that provides a signal path from the second input signal INB to the second output signal OUTB across the barrier 108.

It is understood that any practical number of transmit, receive, and transmit/receive modules can be formed on the first and/or second die to meet the needs of a particular application. It is further understood that transmit, receive, and transmit/receive modules can comprise the same or different components. In addition, in embodiments, bi-directional communication is provided across the barrier. Further, circuitry in the first and/or second die can be provided to process signals, perform routing of signals, and the like. In some embodiments, sensing elements are formed in, on, or about the first and/or second die.

Figure 2:
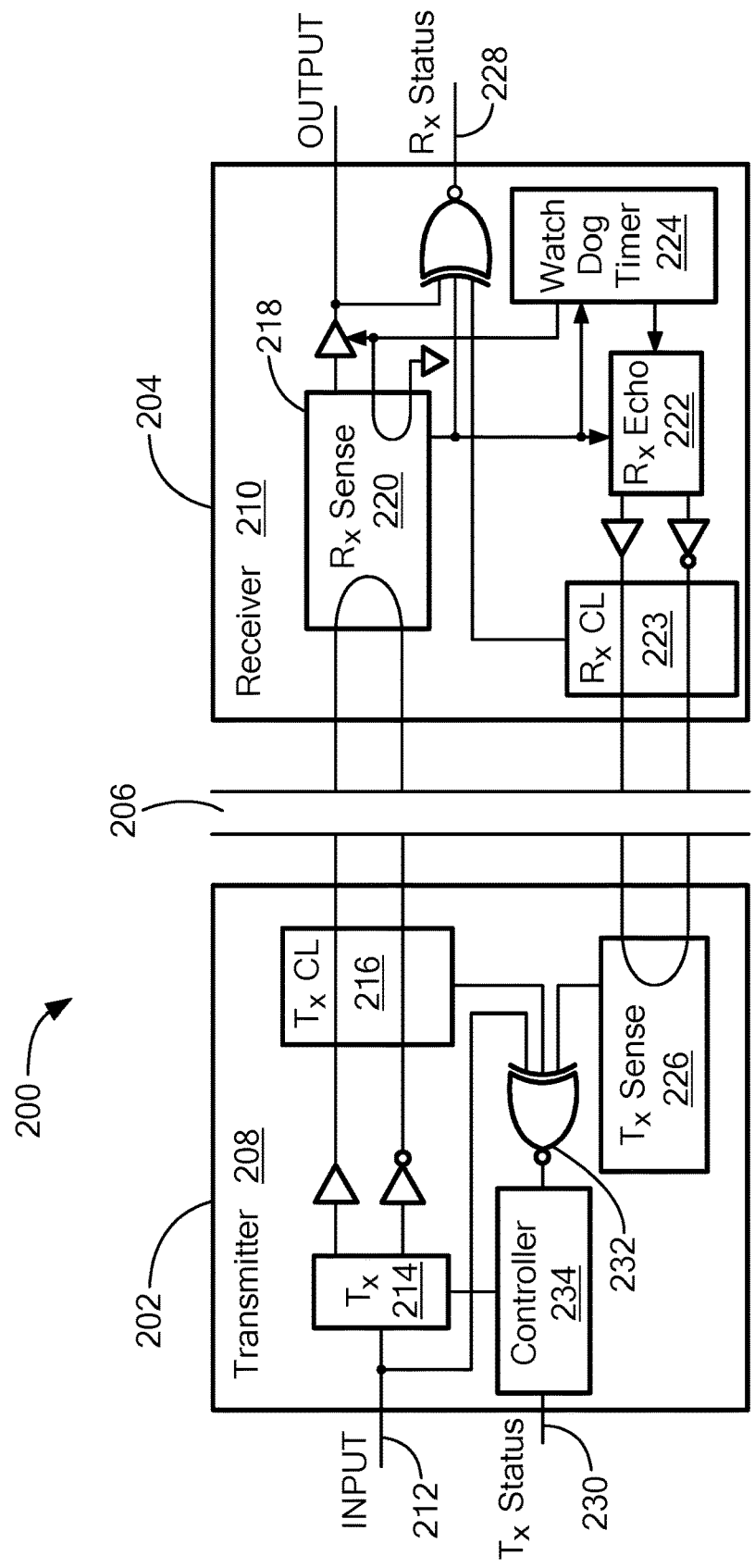
FIG. 2 is a schematic representation of a signal isolator having magnetic signal latching in accordance with example embodiments of the invention.

FIG. 2 shows an example signal isolator 200 having magnetic signal latching of signals from a transmitter 202 to a receiver 204 separated by an isolation barrier 206. In embodiments, the transmitter 202 is disposed on a first die 208 and the receiver 204 is disposed on a second die 210, where the first and second die have different voltage domains.

An INPUT signal 212 is provided to a transmit module 214 that provides a differential output signal to a transmit current latch module 216, which transmits signals in the form of a magnetic signal across the barrier 206 to a receiver Rx module 218. In embodiments, the receiver module 218 includes a magnetic field sensing element 220. In embodiments, the receiver module 218 includes a bi-stable magnetoresistive element. The receive module 218 provides an OUTPUT signal that can be coupled to an output pin of a signal isolator IC package.

While example embodiments are shown as transmitting differential signals, in other embodiments non-differential signals are transmitted and received. It is understood that any suitable signal transmission configuration can be used.

In embodiments, the receiver 204 includes a receiver echo module 222 coupled to the receiver Rx module 218 that receives the signal sensed by the magnetic field sensing element 220. The latched value in the receive current latch module 223 is transmitted in the form of a magnetic signal across the barrier 206 to a transmitter Rx module 226. As described more fully below, the receiver 204 can generate a receive status signal 228 and the transmitter 202 can generate a transmit status signal 230.

While a signal channel is shown, it is understood that additional channels in either direction can be added to meet the needs of a particular application.

When the INPUT 212 changes state, the transmit module 214 outputs a current pulse representing the INPUT state, creating a magnetic field on the receiver 204. In embodiments, the receiver rx module 218 detects the change of state and latches the detected value, which represents the changed state of the data at the INPUT. In order to quickly recover from any data disruption during the data transmission or reception process, a feedback mechanism can be implemented.

The receiver echo module 222 value latched by the receive current latch module 223 is sent to the transmitter rx module 226 which latches the value and provides this value to a combiner 232. The transmit current latch module 216 provides the latched last data transmission sent to the receiver side to the combiner 232, which also receives the INPUT signal 212. In one particular embodiment, the combiner is provided as a logical NOR. The combiner 232 output is provided to a controller 234, which receives the value in the transmit module 214.

If either the transmit current latch module 216 value or the transmitter rx module 226 value do not agree with the INPUT, then the OUTPUT could be different than the INPUT. In an example embodiment, the transmitter 202 resends a pulse representing the INPUT data state to correct for any inconsistency in the transmitter rx module 226 and the INPUT for setting the OUTPUT equal to the INPUT.

In order to make the OUTPUT immune to electrical disruptions that can disturb the data state at the OUTPUT, the isolator latches transmission information at the receiver rx module 218 in magnetic form. Similarly, latching the transmitted data state at the transmitter rx module 226 in magnetic form makes the correction scheme immune to electrical disturbances from the environment.

In embodiments, in order to be able to distinguish between no data state changes and a non-functional transmitter or receiver device, the rx echo module 222 can transmit a signal that is an inverse of the state of the receiver rx module 218 periodically as determined by the watch dog timer 224. The rx echo module 222 can be triggered by toggling the state of the receiver rx module 218. When the transmission from the rx echo module 222 is detected by the transmitter rx module 226, the transmit controller 234 recognizes that the state of the transmitter rx module 226 does not equal the INPUT state and resends the last data transmission. The receiver rx module 218 detects the transmission and determines that the transmit side is functioning properly. The receiver side echoes the data transition to the transmitter side correcting the state of the transmitter rx module 226 indicating that the receiver side is working properly. If this round trip reset of the data is not completed properly, the transmit status signal 230 and/or the receive status signal 228 can indicate that a fault has occurred.

Figure 3:
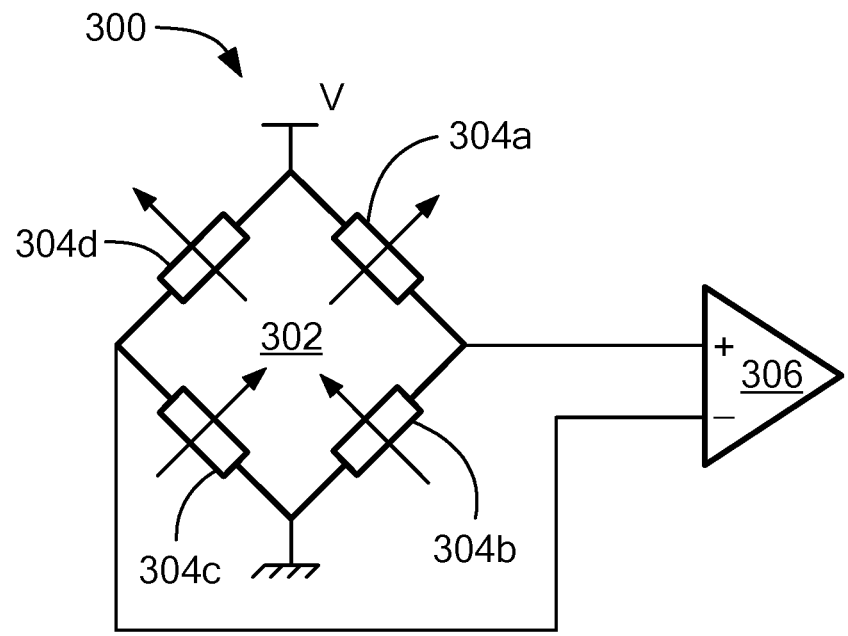
FIG. 3 is a schematic representation of an example magnetic field sensing element that can form a portion of the signal isolator of FIG. 2.
Figure 4:
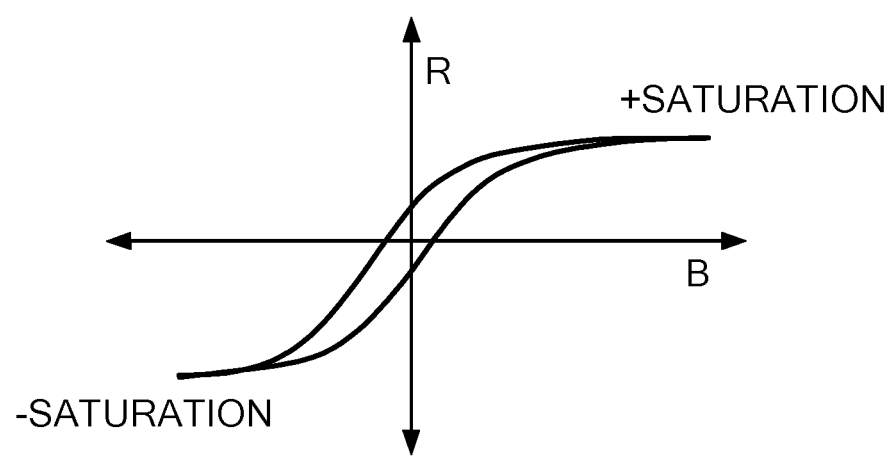
FIG. 4 is a waveform diagram of an example signal for the magnetic field sensing element of FIG. 3.

FIG. 3 shows an example magnetoresistive sensor 300 having a bridge configuration 302. MR elements 304a and 304c will saturate in one direction and MR elements 304b and 304d will saturate in the opposite direction. These saturation levels will be latched, i.e. remain in state, until an opposite magnetic field of large enough amplitude overcomes the coercive force of the MR element, as shown in FIG. 4, changing the state of the MR magnetic latch. In the illustrative embodiments, these opposite states of the magnetoresistive sensing elements 304a-d are coupled to an amplifier or comparator 306 to generate an output voltage equal to the latched state of the MR elements.

Figure 5A:
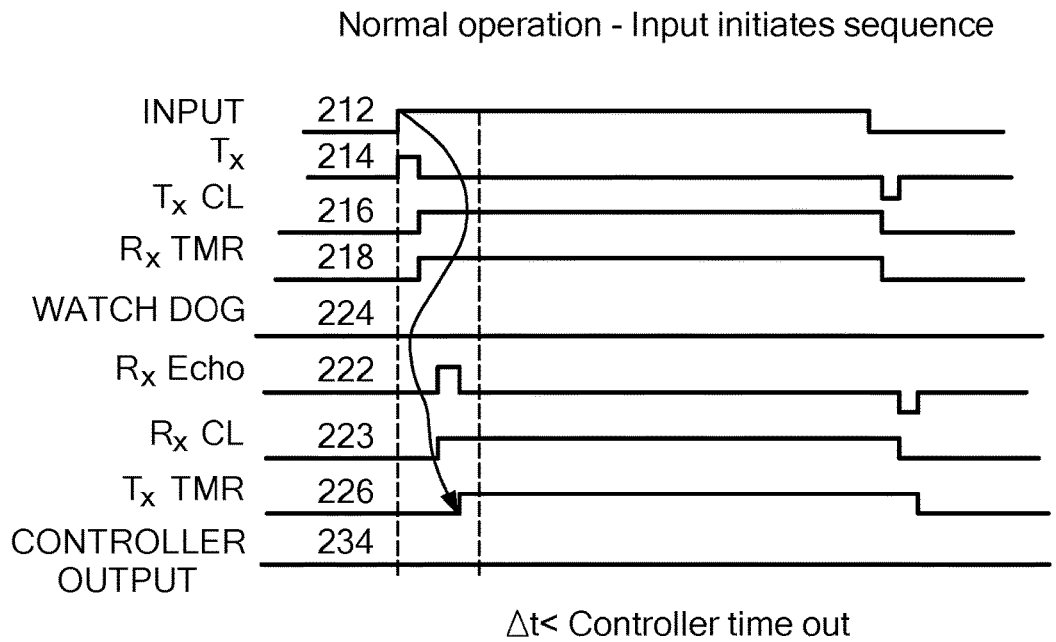
FIG. 5A is a waveform diagram of example signals generated by an illustrative signal isolator in a first mode.

FIG. 5A shows example waveforms for an example signal isolator having magnetic signal latching. The example waveforms represent the output state of the elements of FIG. 2. For example, waveform Tx CL corresponds to the output of the transmit current latch module 216 in FIG. 2. As can be seen, a transition on the INPUT signal to a logical ONE generates a Tx pulse output by the transmit module 214 is transmitted across the barrier, and is latched during the transmission. This pulse is detected and latched as Rx TMR. Rx Echo receives the state of Rx TMR and generates a pulse which is transmitted across the barrier, during which it is latched as Rx CL, for detection and latching as Tx TMR. Since a timeout for the controller was not exceeded, the controller output does not transition. In embodiments, the timeout corresponds to a time from a transition of the INPUT signal to a transition of TX TMR.

Figure 5B:
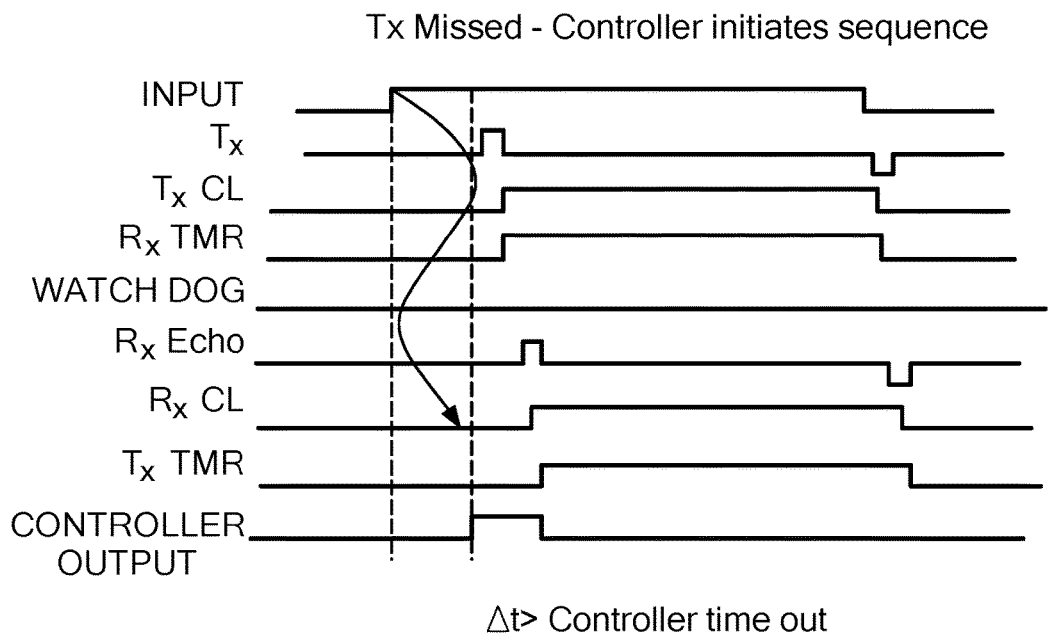
FIG. 5B is a waveform diagram of example signals generated by an illustrative signal isolator in a second mode.

FIG. 5B shows example waveforms that have some similarity with FIG. 5A where a controller timeout is exceeded. In the illustrated sequence, the time from the INPUT signal transitioning to a ONE state to the time the Tx TMR signal (226 in FIG. 2) exceeds the timeout value. For example, a disruption causes the Tx current pulse in response to the rising edge of the INPUT signal to be missed, so that Tx CL, Rx TMR, Rx Echo signals do not transition, so that the Tx TMR signal monitored by the controller does not transition. After the controller detects that the timeout has been exceeded to see state agreement between the INPUT signal and Tx TMR, the controller generates a pulse that causes the transmitter to resend a Tx pulse, which is latched as Tx CL during the transmission, across the barrier to the receiver Rx TMR. The Rx Echo signal generates a pulse that is latched as Rx CL during the transmission across the barrier for detection and latching as Tx TMR after which the controller output resets.

Figure 5C:
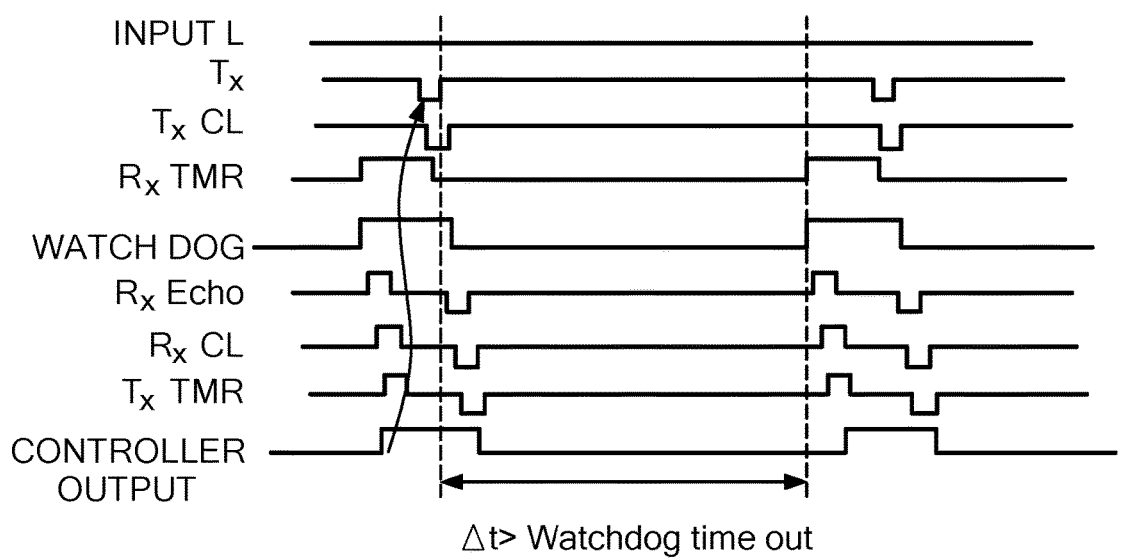
FIG. 5C is a waveform diagram of example signals generated by an illustrative signal isolator in a third mode.

FIG. 5C shows example waveforms when a watchdog timer signal times out. If the INPUT signal does not transition for a selected amount time, the watchdog timer changes the state of the Rx TMR triggering a signal causing Rx Echo to generate a pulse. In an example embodiment, the rising edge of the watchdog timer signal causes the Rx Echo signal to generate a positive pulse and the falling edge of the watchdog timer signal causes the Rx Echo signal to generate a negative pulse.

The controller recognizes that the INPUT signal and Tx TMR do not match and generates a pulse that causes the last transmission, here a negative pulse to be resent to the receiver, which is detected by Rx TMR. With reception of this pulse, it can be determined that the transmitter is functioning properly. The Rx Echo signal transitions, which causes the Rx CL signal to transition and send a signal to the transmitter. Upon detection, the Tx TMR signal transitions indicating that the receiver side is functioning properly. The Tx Status and/or Rx Status signals 230, 228 (FIG. 2) can be transitioned to an active state in the event the transmitter and/or receiver is not functioning properly.

Figure 6:
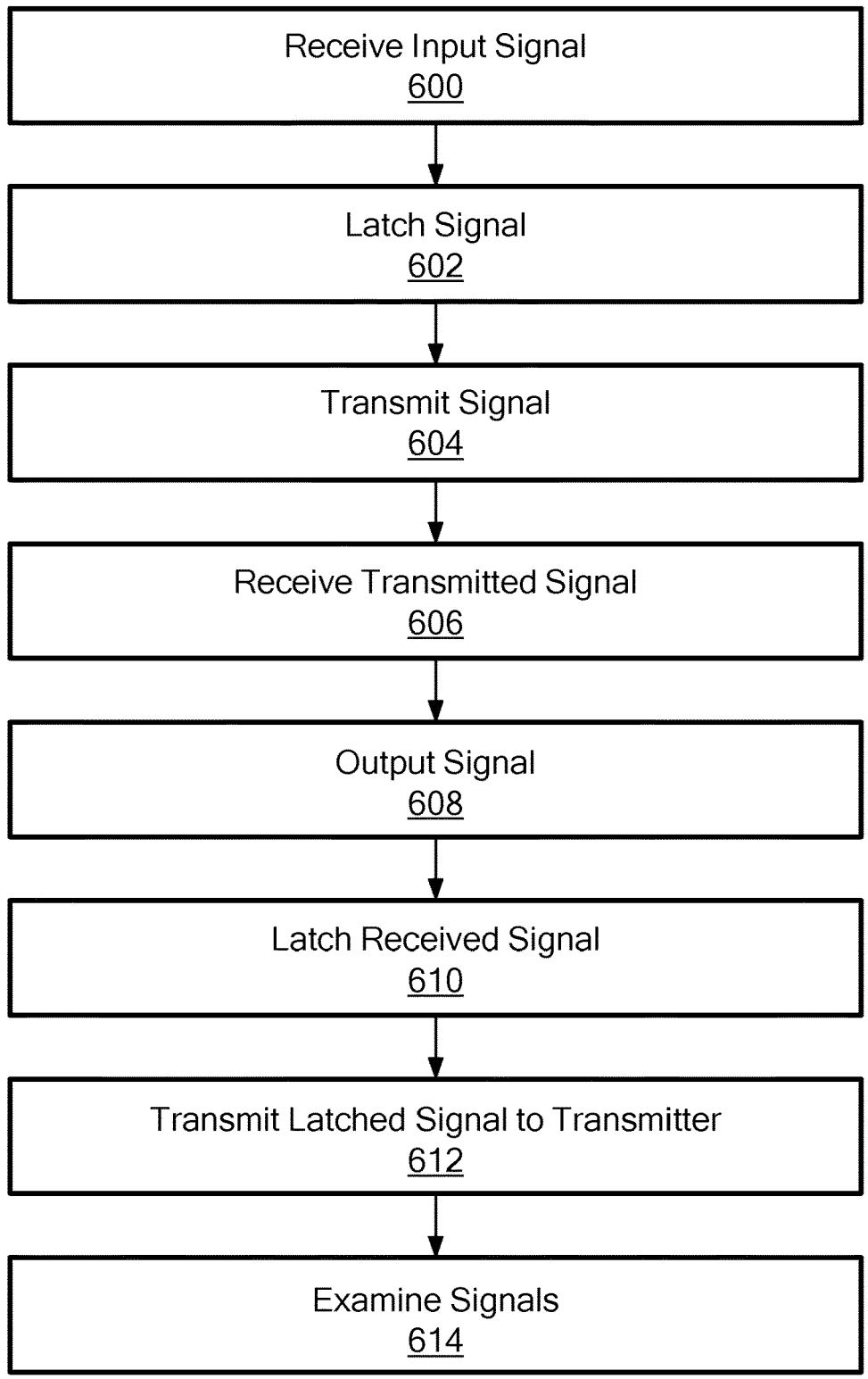
FIG. 6 is a flow diagram showing an example sequence of steps for a signal isolator.

FIG. 6 shows an example sequence of steps for transmitting a signal with magnetic latching. In step 600, an input is received, such as at an input pin of a signal isolator. In step 602, the input signal is transmitted across a barrier, and latched during the transmission, to a receiver in step 604. In embodiments, a magnetoresistive element is used to detect and latch the signal from the transmitter. In step 606, the transmitted signal is received by the receiver. In step 608, the signal can be output by the isolator, such as on an output pin.

In step 610, the received signal is transmitted across, and latched during the transmission, the barrier to a sensing element on the transmitter in step 612. In embodiments, the sensing element includes a bi-stable magnetoresitive element. In step 614, signals can be examined to determine whether the receiver and/or transmitter are operating properly. In one embodiment, the transmitter examines the input signal, the latched input signal, and the latched received signal from the receiver. If signals do not match, a controller can retransmit a signal to the receiver. In embodiments, a watchdog timer can be used to determine proper operation when data is not being sent.

In a further embodiment, the current latch used to detect the transmission of the magnetic field to the other side of the barrier, can also be used to detect other current sources on chip. For example it can be used to detect the input current or output drive current; or it could be used to detect current flowing in a shield, or any current needed to be detected as a circuit element as part of a design.

It is understood that the magnetic field sensing elements can comprise any suitable magneto-resistive technologies, including AMR, GMR, TMR, or other magneto-resistive technology. Example transmissions can be provided as pulsed current, direct current, continuous frequency (e.g., On-off-Keying or OOK) or other suitable data transmission method.

While example embodiments are shown having a transmitter and receiver on separate die, in other embodiments, they are on the same die. In addition, each die can have any combination of drivers and receivers and each driver and receiver data transmission channel can share any of the fast recovery or diagnostic features or have such features for each individual data channel. In embodiments, outputs can be in buffered with a push-pull, open drain or other such output driver, or the output can be a magneto-resistive device with change in resistance indicating logic states.

Signal isolators in accordance with example embodiments that transmit data across the isolation barrier using pulses to encode data state transitions have low quiescent and data transmission power consumption. Conventional signal isolators that use pulses to encode data transitions tend to be prone to output data errors where the output data state does not follow the input data state during the occurrence of electrical disturbances. The disturbances can be created by any one of many different electrical phenomenon that can disrupt the data state that is latched at the receiver side by an electrical circuit that holds the data state. The external disturbance can cause the electric circuit latch to change states.

Known digital isolators that use on-off keying recover quickly from data disturbances by continuous data transmission across the barrier which requires high power consumption during one of the data states when a signal is being continuously transmitted across the isolation barrier. When using on-off keying, the data state when the frequency transmission is off cannot be distinguished from a transmitter that is non-functional.

By using a magneto-resistive latch to hold the data state on the receiver side in accordance with example embodiments of the invention, the digital data is preserved on the transmitter and receiver side during external events that disrupt the electrical operation of the transmitter or receiver making it more immune to disturbance by external electrical phenomenon than other isolator technologies. In addition, echo feedback in example embodiments of the invention ensures that if the transmission pulse is missed or the receiver pulse is missed during an electrical disturbance the data output is quickly set equal to the data input, while having the benefit of low power consumption and quick data recovery.

Figure 7:
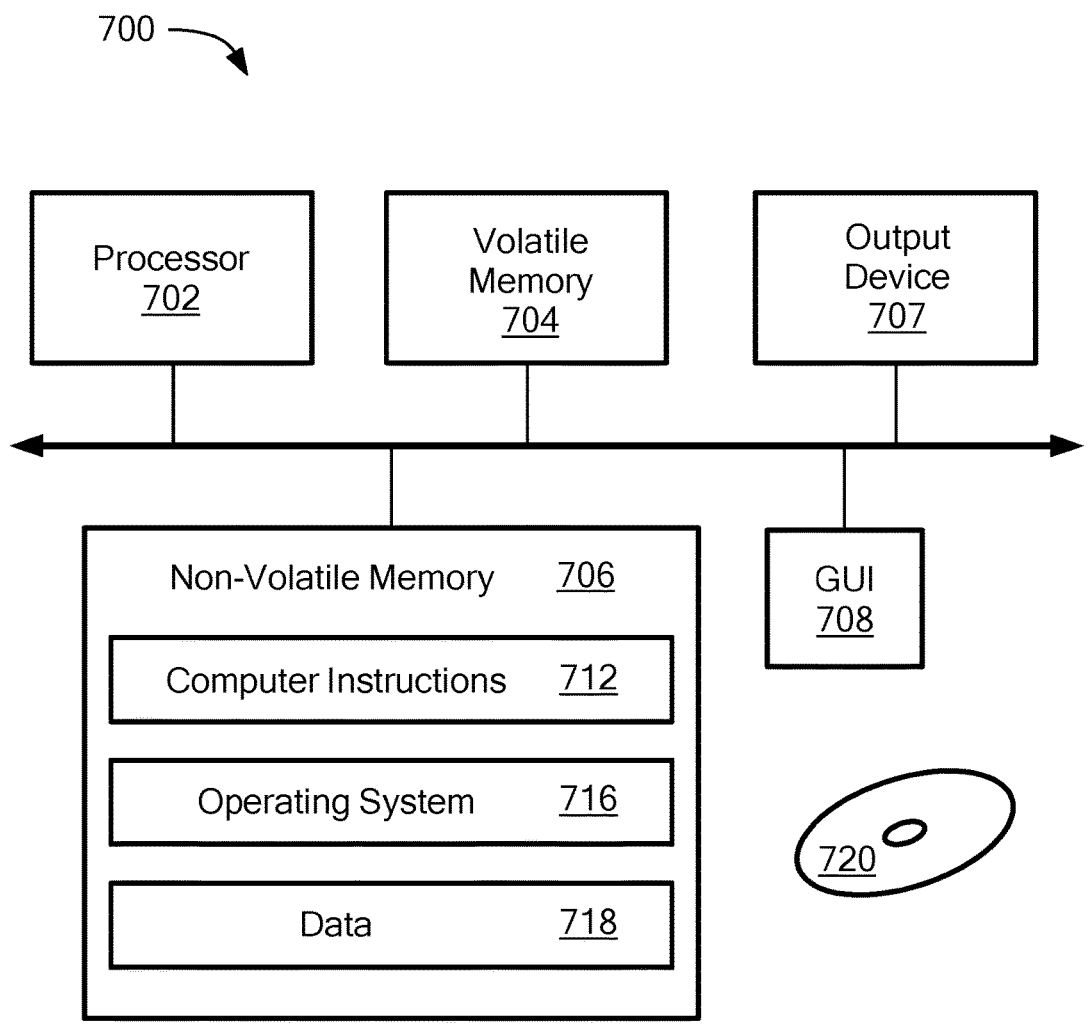
FIG. 7 is a schematic representation of an example computer that may perform at least a portion of the processing described herein.

FIG. 7 shows an exemplary computer 700 that can perform at least part of the processing described herein. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A signal isolator, comprising:
    a transmitter comprising:
        a transmit module to receive an input signal; and
        a transmit current latching module to magnetically latch an output of the transmit module; and
    a receiver comprising:
        a receive module including a receiver magnetic field sensing element to detect and magnetically latch a signal from the transmit current latching module,
    wherein the transmit module includes a transmitter receive module to receive signals from the receiver, and
    wherein the receiver includes:
    a receiver echo module coupled to the receiver magnetic field sensing element; and
    a receive current latching module to receive an output of the receiver echo module and transmit an output to the transmitter receive module.

2. The signal isolator according to claim 1, further comprising a barrier region between the transmitter and the receiver.

3. The signal isolator according to claim 1, wherein the transmitter and the receiver are disposed on separate die.

4. The signal isolator according to claim 1, wherein the receiver magnetic field sensing element includes a magnetoresistive element.

5. The signal isolator according to claim 4, wherein the magnetoresistive element comprises a bi-stable magnetoresistive element.

6. The signal isolator according to claim 1, wherein the transmit module includes a controller.

7. The signal isolator according to claim 6, wherein the controller monitors a state of the input signal, the transmit current latching module, and a transmitter receive module.

8. The signal isolator according to claim 7, wherein the controller is configured to resend a signal from the transmitter to the receiver when a disruption of the input signal is detected.

9. The signal isolator according to claim 8, wherein the disruption is detected when a timeout is exceeded.

10. The signal isolator according to claim 1, further including a watchdog timer coupled to a receive echo module to detect faults in the receiver module and/or transmit module when data signals are not present.

11. A method of communicating signals from a transmitter to a receiver isolated from the transmitter, comprising:
    employing a transmitter having a transmit module to receive an input signal and a transmit current latching module to magnetically latch an output of the transmit module; and
    employing a receiver having a receive module including a receiver magnetic field sensing element to detect and magnetically latch a signal from the transmit current latching module,
    wherein the transmit module further includes a transmitter receive module to receive signals from the receiver, and
    wherein the receiver further includes:
    a receiver echo module coupled to the receiver magnetic field sensing element; and
    a receive current latching module to receive an output of the receiver echo module and transmit an output to the transmitter receive module.

12. The method according to claim 11, further employing a barrier region between the transmitter and the receiver.

13. The method according to claim 11, wherein the transmitter and the receiver are disposed on separate die.

14. The method according to claim 11, wherein the receiver magnetic field sensing element includes a magnetoresistive element.

15. The method according to claim 14, wherein the magnetoresistive element comprises a bi-stable magnetoresistive element.

16. The method according to claim 11, further including employing a controller to monitor a state of the input signal, the transmit current latching module, and a transmitter receive module.

17. The method according to claim 16, wherein the controller is configured to resend a signal from the transmitter to the receiver when a disruption of the input signal is detected.

18. The method according to claim 17, wherein the disruption is detected when a timeout is exceeded.

19. The method according to claim 11, further including employing a watchdog timer coupled to a receive echo module to detect faults in the receiver module and/or transmit module when data signals are not present.

20. A signal isolator, comprising:
    a transmitter comprising:
        a transmit means to receive an input signal;
        a transmit current latching means to magnetically latch an output of the transmit means; and
    a receiver comprising:
        a receive means including a receiver magnetic field sensing means for detecting and magnetically latching a signal from the transmit latching means,
    wherein the transmit means further includes a transmitter receive means for receiving signals from the receiver, and wherein the receiver further includes:
a receiver echo means coupled to the receiver magnetic field sensing means; and
a receive current latching means for receiving an output of the receiver echo means and transmitting an output to the transmitter receive means.

21. A signal isolator, comprising:
a transmitter comprising:
a transmit module to receive an input signal;
a transmit current latching module to magnetically latch an output of the transmit module; and
a receiver comprising:
a receive module including a receiver magnetic field sensing element to detect and magnetically latch a signal from the transmit current latching module; and
a watchdog timer coupled to a receive echo module to detect faults in the receiver module and/or transmit module when data signals are not present,
wherein the transmit module includes a transmitter receive module to receive signals from the receiver.

22. The signal isolator according to claim 21, further comprising a barrier region between the transmitter and the receiver.

23. The signal isolator according to claim 21, wherein the transmitter and the receiver are disposed on separate die.

24. The signal isolator according to claim 21, wherein the receiver magnetic field sensing element includes a magnetoresistive element.

25. The signal isolator according to claim 24, wherein the magnetoresistive element comprises a bi-stable magnetoresistive element.

26. The signal isolator according to claim 21, wherein the transmit module includes a controller.

27. The signal isolator according to claim 26, wherein the controller monitors a state of the input signal, the transmit current latching module, and a transmitter receive module.

28. The signal isolator according to claim 27, wherein the controller is configured to resend a signal from the transmitter to the receiver when a disruption of the input signal is detected.

29. The signal isolator according to claim 28, wherein the disruption is detected when a timeout is exceeded.

30. The signal isolator according to claim 20, further comprising a barrier region between the transmitter and the receiver.

31. The signal isolator according to claim 20, wherein the transmitter and the receiver are disposed on separate die.

32. The signal isolator according to claim 20, wherein the receiver magnetic field sensing means includes a magnetoresistive element.

33. The signal isolator according to claim 32, wherein the magnetoresistive element comprises a bi-stable magnetoresistive element.

34. The signal isolator according to claim 20, wherein the transmit means includes a controller.

35. The signal isolator according to claim 34, wherein the controller monitors a state of the input signal, the transmit current latching means, and a transmitter receive means.

36. The signal isolator according to claim 35, wherein the controller is configured to resend a signal from the transmitter to the receiver when a disruption of the input signal is detected.

37. The signal isolator according to claim 36, wherein the disruption is detected when a timeout is exceeded.

38. The signal isolator according to claim 20, further including a watchdog timer coupled to a receive echo means to detect faults in the receive means and/or transmit means when data signals are not present.

39. A method of communicating signals from a transmitter to a receiver isolated from the transmitter, comprising:
employing a transmitter having a transmit module to receive an input signal and a transmit current latching module to magnetically latch an output of the transmit module;
employing a receiver having a receive module including a receiver magnetic field sensing element to detect and magnetically latch a signal from the transmit current latching module; and
employing a watchdog timer coupled to a receive echo module to detect faults in the receiver module and/or transmit module when data signals are not present,
wherein the transmit module further includes a transmitter receive module to receive signals from the receiver.

40. The method according to claim 39, further employing a barrier region between the transmitter and the receiver.

41. The method according to claim 39, wherein the transmitter and the receiver are disposed on separate die.

42. The method according to claim 39, wherein the receiver magnetic field sensing element includes a magnetoresistive element.

43. The method according to claim 42, wherein the magnetoresistive element comprises a bi-stable magnetoresistive element.

44. The method according to claim 39, further including employing a controller to monitor a state of the input signal, the transmit current latching module, and a transmitter receive module.

45. The method according to claim 44, wherein the controller is configured to resend a signal from the transmitter to the receiver when a disruption of the input signal is detected.

46. The method according to claim 45, wherein the disruption is detected when a timeout is exceeded.

47. A signal isolator, comprising:
a transmitter comprising:
a transmit means to receive an input signal;
a transmit current latching means to magnetically latch an output of the transmit means;
a receiver comprising:
a receive means including a receiver magnetic field sensing means for detecting and magnetically latching a signal from the transmit latching means; and
a watchdog timer coupled to a receive echo means to detect faults in the receive means and/or transmit means when data signals are not present,
wherein the transmit means further includes a transmitter receive means for receiving signals from the receiver.

48. The signal isolator according to claim 47, further comprising a barrier region between the transmitter and the receiver.

49. The signal isolator according to claim 47, wherein the transmitter and the receiver are disposed on separate die.

50. The signal isolator according to claim 47, wherein the receiver magnetic field sensing means includes a magnetoresistive element.

51. The signal isolator according to claim 50, wherein the magnetoresistive element comprises a bi-stable magnetoresistive element.

52. The signal isolator according to claim 47, wherein the transmit means includes a controller.

53. The signal isolator according to claim 52, wherein the controller monitors a state of the input signal, the transmit current latching means, and a transmitter receive means.

54. The signal isolator according to claim 53, wherein the controller is configured to resend a signal from the transmitter to the receiver when a disruption of the input signal is detected.

55. The signal isolator according to claim 54, wherein the disruption is detected when a timeout is exceeded.

* * * * *